(12) United States Patent
Raz et al.

(10) Patent No.: US 7,796,068 B2
(45) Date of Patent: Sep. 14, 2010

(54) SYSTEM AND METHOD OF MULTI-CHANNEL SIGNAL CALIBRATION

(75) Inventors: Gil M. Raz, Concord, MA (US); Jeffrey H. Jackson, Arlington, MA (US)

(73) Assignee: GMR Research & Technology, Inc., Concord, MA (US)

( * ) Notice: Subject to any disclaimer, the term of this patent is extended or adjusted under 35 U.S.C. 154(b) by 21 days.

(21) Appl. No.: 12/218,619

(22) Filed: Jul. 16, 2008

(65) Prior Publication Data

US 2009/0033529 A1    Feb. 5, 2009

Related U.S. Application Data

(60) Provisional application No. 60/959,663, filed on Jul. 16, 2007.

(51) Int. Cl.
*H03M 1/10*    (2006.01)

(52) U.S. Cl. .................. 341/120; 341/117; 341/118; 341/119

(58) Field of Classification Search .......... 341/117–120
See application file for complete search history.

(56) References Cited

U.S. PATENT DOCUMENTS

| | | | | |
|---|---|---|---|---|
| 5,357,257 A | * | 10/1994 | Nevin | ........................ 342/165 |
| 6,195,435 B1 | * | 2/2001 | Kitamura | ...................... 381/18 |
| 6,639,537 B1 | | 10/2003 | Raz | |
| 7,173,555 B2 | | 2/2007 | Raz | |
| 7,388,932 B1 | * | 6/2008 | Zhang et al. | ................. 375/316 |
| 2006/0133470 A1 | | 6/2006 | Raz et al. | |
| 2007/0053455 A1 | * | 3/2007 | Sugiyama | .................... 375/260 |
| 2008/0205667 A1 | * | 8/2008 | Bharitkar et al. | ............. 381/103 |

* cited by examiner

*Primary Examiner*—Jean B Jeanglaude
(74) *Attorney, Agent, or Firm*—Kriegsman & Kriegsman

(57) ABSTRACT

A signal processing system for reducing calibration-related distortions in a complete-channel signal generated by a multi-channel subsystem, such as an interleaved ADC, includes a channel separator for separating the distorted digital signal into its various sub-channels and a single-channel corrector for independently processing each sub-channel to reduce distortion products present therein. The system additionally includes a subchannel re-combiner for combining the plurality of sub-channels processed by the single-channel corrector and a multi-channel corrector for calibrating each of plurality of sub-channels relative to one another to yield an equalized, complete-channel output signal. The multi-channel corrector includes a bank of optimized filters, each filter being assigned to a corresponding sub-channel of the complete-channel signal. In one embodiment, one of the plurality of sub-channels is selected as an ideal reference signal and the filters assigned to the remaining sub-channels are optimized to yield outputs which match the ideal reference signal.

14 Claims, 14 Drawing Sheets

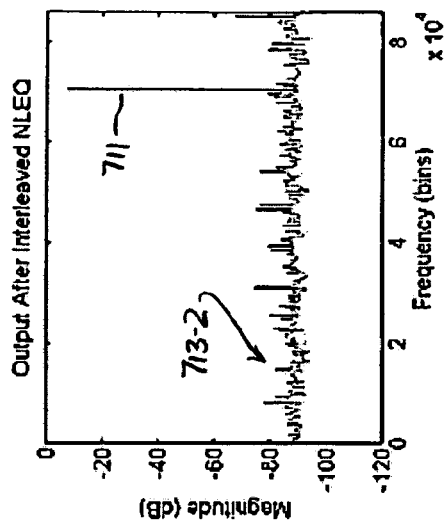
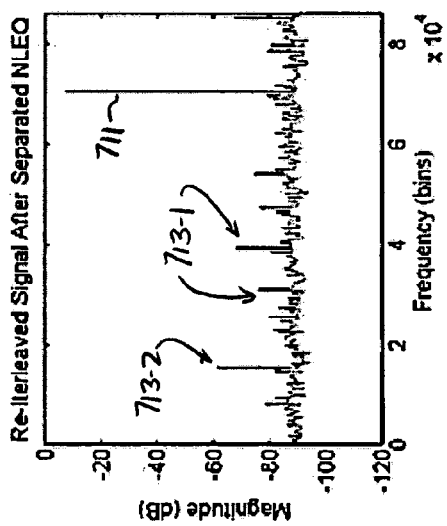
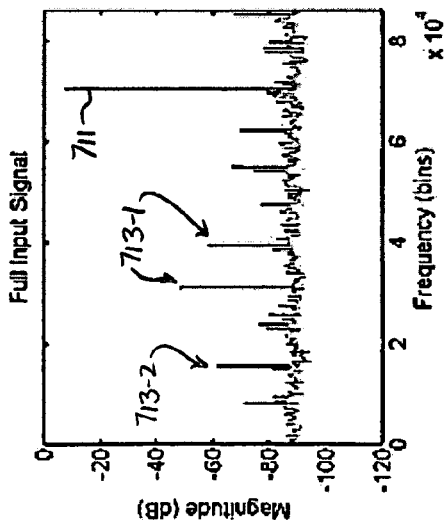

SYSTEM AND METHOD OF MULTI-CHANNEL SIGNAL CALIBRATION

CROSS-REFERENCE TO RELATED APPLICATIONS

The present application claims the benefit under 35 U.S.C. 119(e) of U.S. provisional Patent Application Ser. No. 60/959,663, filed Jul. 16, 2007, the disclosure of which is incorporated herein by reference.

BACKGROUND OF THE INVENTION

The present invention relates generally to the field of digital signal processing and more particularly to systems and methods for calibrating multi-channel subsystems.

In the field of analog and digital communications, a signal is commonly defined as anytime-varying or spatial-varying quantity that conveys information (e.g., an energy signal or power signal). Presently, there exists a wide variety of devices that are designed to process analog and/or digital signals in some capacity.

To enhance its overall performance, signal processing systems often rely upon multi-channel subsystems. As defined herein, a multi-channel subsystem relates to a plurality of individual signal processing elements which are combined together. As can be appreciated, the use of a combination of signal processing elements, rather than a single element or device, serves to improve the overall dynamic range and resolution of the signal processing system in the particular domain in which it senses or samples (e.g., time, frequency and angle space, etc.) and, as such, is highly useful in the art.

Examples of well-known multi-channel subsystems include: (i) analog-to-digital conversion systems which comprise a plurality of individual analog-to-digital converters (ADCs) which are combined to yield a signal processing system with a higher sample frequency and improved amplitude resolution; (ii) antenna arrays which comprise multiple antenna elements which are combined to yield a system with improved spatial angle resolution and dynamic range; and (iii) sub-band sensor systems which comprise multiple individual components that handle adjacent frequency bands, the components being combined to cover a wideband of input signals.

The performance of signal processing systems which rely upon multi-channel subsystems is contingent upon multiple factors.

As a first factor, the performance of signal processing systems which rely upon multi-channel subsystems is contingent upon the individual performance of each element, or device, within the multi-channel subsystem. For example, the performance of an analog-to-digital conversion system of the type described above is largely dependent upon the individual performance characteristics of each analog-to-digital converter within the system. Some of the factors that often influence the performance of each signal processing element include, among other things: (i) noise (i.e., broadband signals which are generated by various environmental effects and/or man-made sources); (ii) nonlinear distortion products (e.g., harmonics, intermods, etc.); (iii) interference signals (either environmental or man-made); and (iv) sampling rate (i.e., the rate at which an analog signal is sampled).

Many of the aforementioned factors that influence the performance of each signal processing element are often treated using a non-linear equalizer (NLEQ) digital signal processor at its back end. Examples of NLEQ digital signal processors which are well known in the art are disclosed in U.S. Pat. No. 6,639,537 to G. M. Raz (hereinafter the '537 patent), U.S. Pat. No. 7,173,555 to G. M. Raz (hereinafter the '555 patent) and U.S. Patent Application No. 2006/0133470 to G. M. Raz et al. (hereinafter the '470 application), all of said disclosures being incorporated herein by reference.

As a second factor, the performance of signal processing systems which rely upon multi-channel subsystems is contingent upon the quality of the calibration of each element relative to one another. In particular, when the relationship between the individual elements of a multi-channel subsystem is improperly calibrated (e.g., with respect to their relative sample times, frequencies or locations), the performance of the multi-channel subsystem is significantly compromised, which is highly undesirable.

Traditionally, multi-channel subsystems are calibrated using single-channel correction means. Specifically, multi-channel subsystems are typically calibrated by either (i) improving the individual performance characteristics associated with each element (e.g., with respect to noise and non-linear distortion), as described in detail above, and/or (ii) independently calibrating each element relative to a particular standard. However, it has been found that since both of the aforementioned processes relate solely to single-channel corrections within a multi-channel subsystem, significant relative calibration errors often remain between the plurality of elements, which is highly undesirable.

Referring now to FIGS. 1(a)-(f), there is shown a series of measured graphical representations which are useful in illustrating the inherent problems associated with the use of single-channel correction means for calibrating multi-channel systems. In FIG. 1(a), there is shown a graphical representation of a multi-channel digital output signal produced by a conventional high speed interleaved ADC in response to a two tone input signal 1. As can be seen, the interleaved ADC is responsible for producing a number of sizable distortions D which significantly limit the overall dynamic range of the system, which is highly undesirable.

As noted above, distortion products inherently introduced into the output signal of a multi-channel subsystem are often treated through the independent equalization of each individual sub-channel using well-known digital signal filtering techniques. Accordingly, as seen in FIGS. 1(b) and 1(c), the first step in the single-channel calibration process is to de-interleave (i.e., separate) the multi-channel, or complete-channel, output signal into its individual sub-channels $x_1$, as shown in FIG. 1(b), and $x_2$, as shown in FIG. 1(c). As can be seen, each of sub-channels $x_1$ and $x_2$ includes sizable and unique distortion products D along with two tone signal 1.

Accordingly, each of sub-channels $x_1$ and $x_2$ is independently equalized using well-known digital signal filtering techniques to yield corresponding equalized sub-channels $x_1'$, as shown in FIG. 1(d), and $x_2'$, as shown in FIG. 1(e). As can be seen, the equalization of sub-channels $x_1'$ and $x_2'$ serves to significantly reduce, if not eliminate, the presence of all distortion products D therein. However, it should be noted that when sub-channels $x_1'$ and $x_2'$ are re-interleaved (i.e., combined) to yield an equalized, multi-channel output signal y, as shown in FIG. 1(f), a new non-harmonic distortion N is produced as a direct result of relative calibration errors and other signal discrepancies between the multiple elements, this particular type of distortion being commonly referred to as an interleaved distortion in the art. As can be seen, interleaved distortion product N significantly reduces the dynamic range of the interleaved ADC, which is highly undesirable.

SUMMARY OF THE INVENTION

It is an object of the present invention to provide a novel system and method of multi-channel signal calibration.

It is another object of the present invention to provide a system and method of multi-channel signal calibration which relies upon the calibration of each sub-channel relative to one another.

It is yet another object of the present invention to provide a system and method as described above which utilizes mathematical modeling tools which are neither cumbersome nor computationally complex in nature.

Therefore, according to one feature of the present invention, there is provided a signal processing system comprising (a) a multi-channel subsystem for converting a set of analog input signals into an unequalized, digitized complete-channel output signal which includes a plurality of sub-channels, and (b) an equalization subsystem for calibrating the unequalized, digitized complete-channel output signal to yield an equalized, digitized complete-channel output signal, (c) wherein the equalization subsystem comprises a multi-channel corrector for calibrating the individual sub-channels of the unequalized, digitized complete-channel output signal relative to one another.

According to another feature of the present invention, there is provided a method of processing an unequalized complete-channel output signal produced from a multi-channel subsystem, the complete-channel output signal including a plurality of sub-channels, the method comprising the steps of (a) passing the unequalized complete-channel signal in its entirety into a multi-channel corrector, and (b) calibrating the plurality of sub-channels relative to one another using the multi-channel corrector.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts:

FIGS. 12(a)-(c) depict a first series of graphical representations of a sample signal shown at various times during its transmission through the equalization subsystem shown in FIG. 7, said graphical representations being useful in displaying the benefit of applying multi-channel correction techniques to an interleaved signal;

DETAILED DESCRIPTION OF THE PREFERRED EMBODIMENT

System and Method of Multi-Channel Signal Calibration

Figures 1A, 1B, 1C, 1D, 1E, 1F:
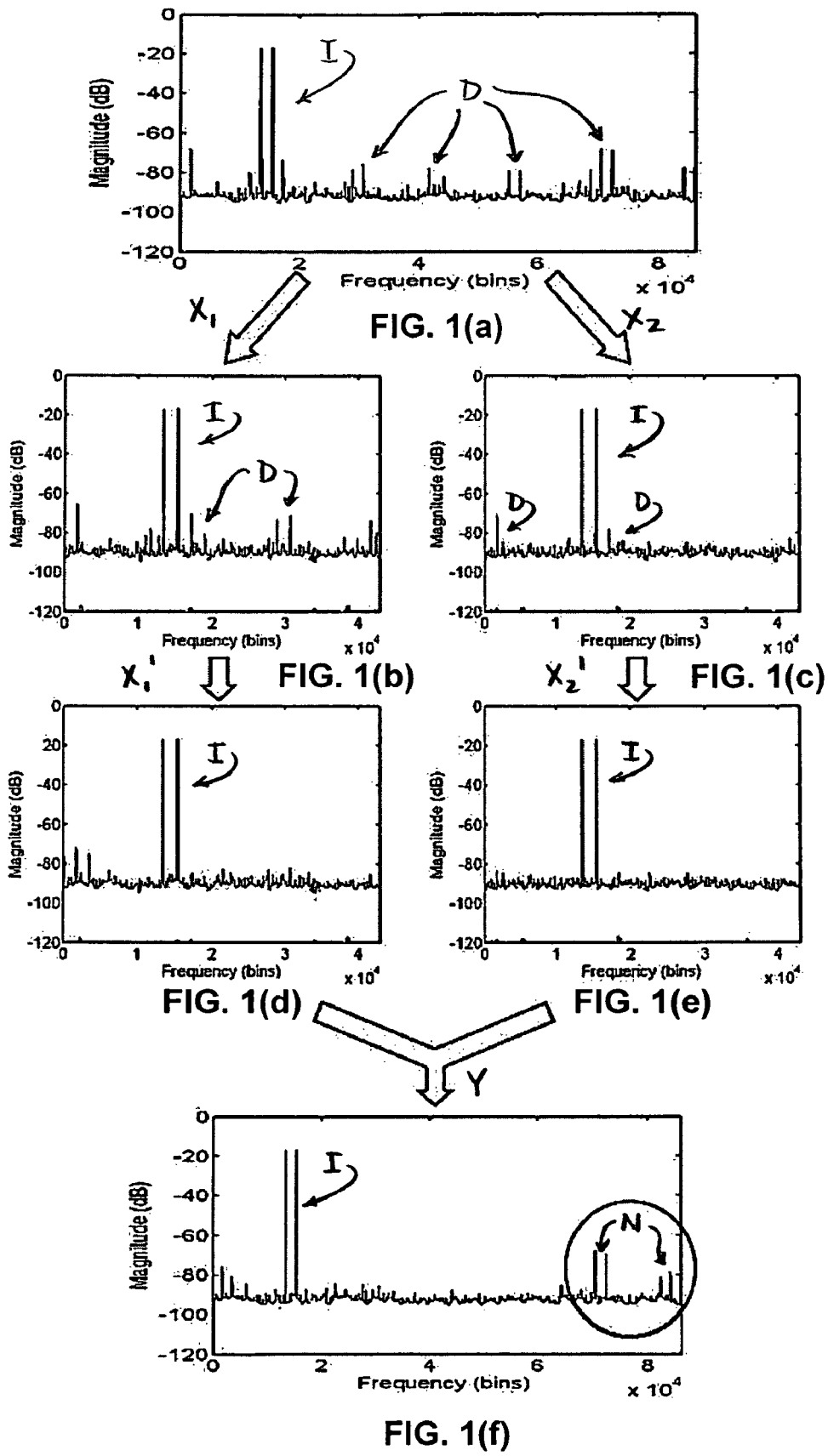
FIGS. 1(a)-(f) are a series of measured graphical representations which are useful in illustrating the inherent problems associated with the conventional use of single-channel correction means for calibrating multi-channel systems which are well-known in the art.
Figure 2:
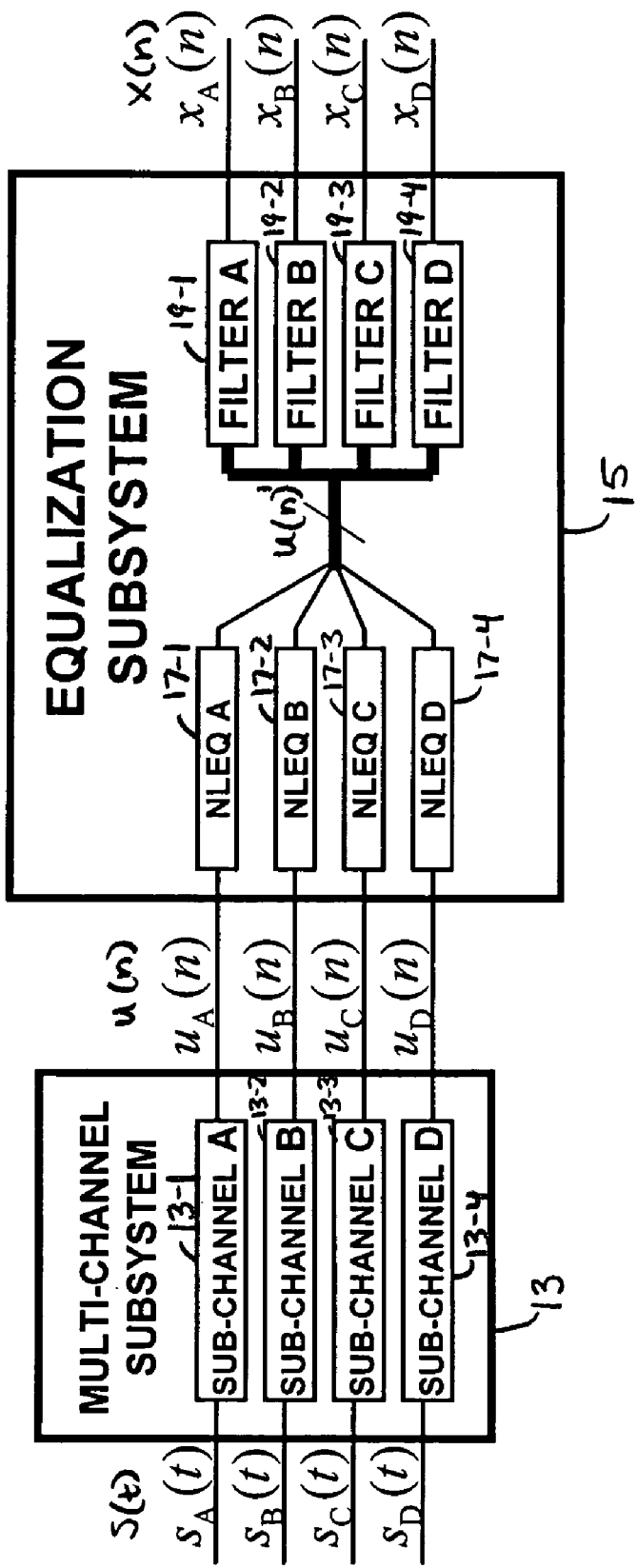
FIG. 2 is a simplified block diagram of a multi-application version of a signal processing system constructed according to the teachings of the present invention.

Referring now to FIG. 2, there is shown a simplified block diagram of a signal processing system constructed according to the teachings of the present invention and identified generally by reference numeral 11. As can be seen, system 11 comprises a multi-channel subsystem 13 which converts a set of analog input signals s(t) into an unequalized set of digitized output signals u(n) and an equalization subsystem 15 which is responsible for, inter alia, calibrating the distorted, complete-channel signal u(n) in such a manner so as to yield an equalized, complete-channel output signal x(n). As will be described in detail below, equalization subsystem 15 minimizes the presence of calibration errors produced by multi-channel subsystem 13 by calibrating the individual sub-channels of output signal u(n) relative to one another, which is highly desirable.

Multi-channel subsystem 13 represents any signal processing device which includes two or more sensing and/or sampling components. As shown herein, each of the set of analog input signals $S_A(t)$, $S_B(t)$, $S_C(t)$ and $S_D(t)$ is processed by corresponding sub-channel devices 13-1, 13-2, 13-3 and 13-4, respectively, to yield complete-channel signal u(n).

Complete-channel u(n) is then calibrated by equalization subsystem 15 to yield complete-channel output signal x(n). Specifically, referring now to FIGS. 2 and 3, complete-channel u(n) is first separated into N-component sub-channels (represented in FIG. 2 as four sub-channels) by a channel separator 16 to yield a set of distorted, digitized output signals $u_n(n)$ (the set of signals being represented as signals $u_A(n)$, $u_B(n)$, $u_C(n)$ and $u_D(n)$ in FIG. 2).

Each sub-channel of digitized signal u(n) is then treated, in isolation of one another, by a single-channel corrector 17 to remove signal distortions present therein which may become a source of discrepancy between sub-channels when re-combined to create the complete-channel digital signal. Specifically, as shown in FIG. 2, sub-channels $u_A(n)$, $u_B(n)$, $u_C(n)$ and $u_D(n)$ are conditioned by single-channel, digital signal equalization elements 17-1, 17-2, 17-3 and 174, respectively. It should be noted that each of single-channel equalization elements 17-1 thru 174 is preferably in the form of any well-known digital signal equalizer that is designed to treat signal distortion products. For example, each equalization element may be in the form of the non-linear equalizers (NLEQs) disclosed in either the '537 patent, the '555 patent or the '470 application.

The corrected single-channel signals are then re-combined by a sub-channel re-combiner 18 to yield a complete-channel digital signal u(n)'. In turn, complete-channel digital signal u(n)' is passed in its entirety, with all sub-channel data, into a multi-channel corrector 19. As seen most clearly in FIG. 2, multi-channel corrector 19 includes a bank of filters (which are represented as filters 19-1 thru 19-4), preferably in the form of any well-known digital signal equalizer that is designed to treat signal distortion. Such filters may take the form of linear equalizers or NLEQs disclosed in either the '537 patent, the '555 patent, or the '470 application. As can be appreciated, each of filters 19-1 thru 19-4 is designed to calibrate one sub-channel data stream from complete-channel signal u(n)', said filter removing the signal points from the other non-designated sub-channels. However, it should be noted that the data from all sub-channels of signal u(n)' is required in order to properly correct each individual sub-channel.

Figure 3:
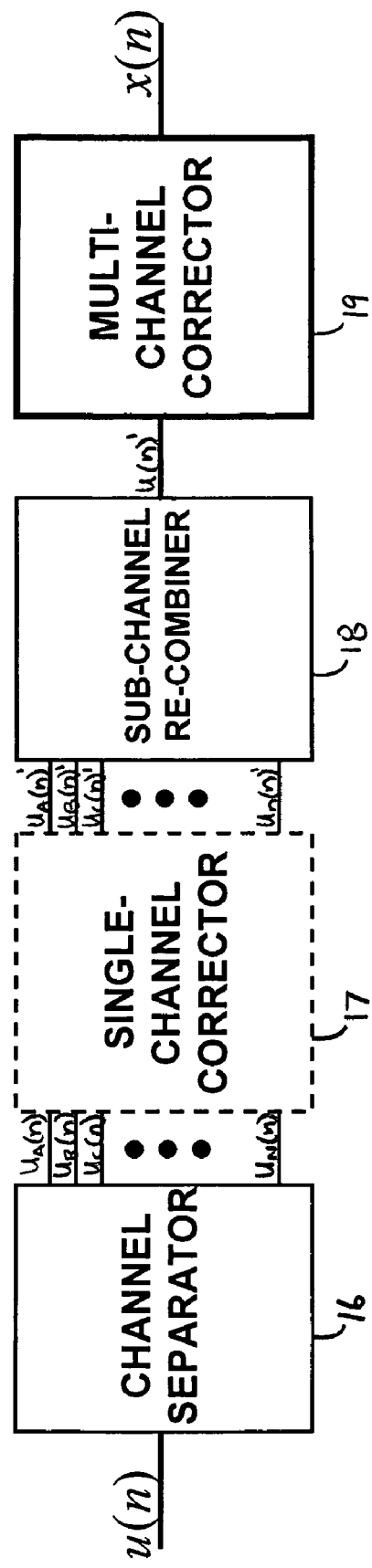
FIG. 3 is simplified block diagram of a more generalized version of the equalization subsystem shown in FIG. 2.

Although not shown in FIGS. 2 and 3, additional channel agreement can be achieved by subsystem 15 by adding a constant DC offset term to each sub-channel to eliminate spurious signals that may occur when information is exchanged across channels. Specifically, after complete-channel digital signal u(n)' is passed through the filters of multi-channel corrector 19, the filtered output signal is then separated into its various sub-channels, with the constant DC difference between each sub-channel and a designated reference sub-channel being added to said sub-channel. The resultant sub-channel signals are then re-combined to create a complete-channel output signal x(n) with reduced inter-channel distortions.

As noted briefly above, signal distortions produced as a result of calibration errors between components of multi-channel subsystems are traditionally treated using single-channel correction means (e.g., through the self-calibration of each individual component). To the contrary, the present invention minimizes the presence of calibration-related signal distortions by calibrating the various sub-channels of a signal relative to one another (e.g., by assuming one sub-channel is the ideal reference signal and then, in turn, equalizing the remainder of sub-channels to match the ideal reference signal). As can be appreciated, the multi-channel signal calibration process of the present invention is more effective in reducing calibration-related signal distortions than traditional single-channel signal calibration methods and, as such, serves as a fundamental novel feature of the present invention.

As will be described further in detail below, the generalized architecture of system 11 can be modified, as deemed necessary, to create a number of application-specific implementations in the signal processing industry, as will be described in detail below.

Analog-to-Digital Converter (ADC) Application

Figure 4:
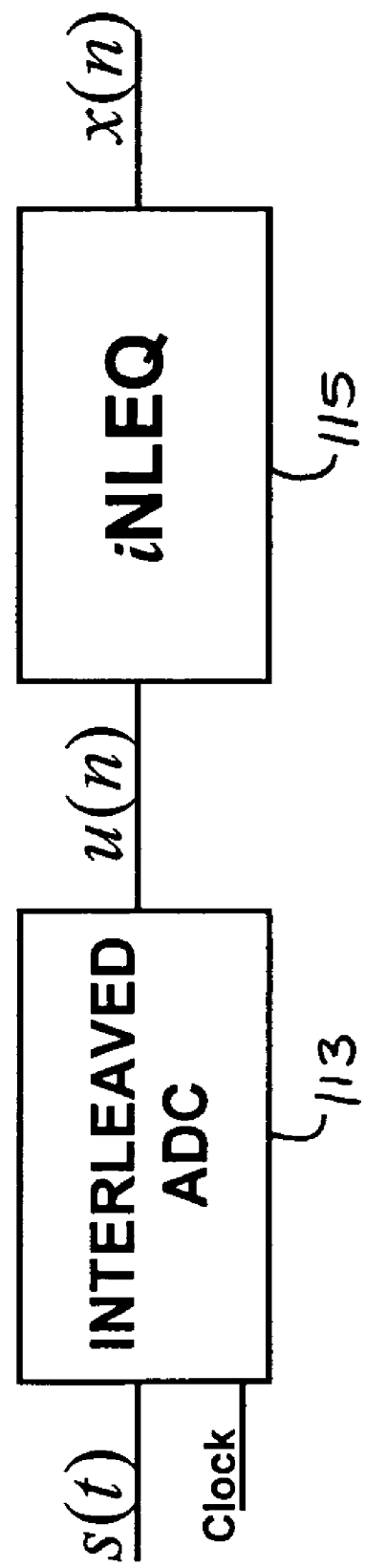
FIG. 4 is a simplified block diagram of an ADC-specific version of a signal processing system constructed according to the teachings of the present invention.

One practical application for system 11 lies with the calibration of an interleaved signal (i.e., of the type produced by multiple interleaved analog-to-digital converters). Specifically, referring now to FIG. 4, there is shown a simplified block diagram of a signal processing system constructed according to the teachings of the present invention and identified generally by reference numeral 111.

As can be seen, signal processing system 111 comprises an interleaved analog-to-digital converter (ADC) 113, connected to a clock, which converts a set of analog input signals s(t) into an unequalized, interleaved output signal u(n) and an equalization subsystem 115 which is responsible for, inter alia, calibrating the distorted, interleaved signal u(n) in such a manner so as to yield an equalized, interleaved output signal x(n).

Interleaved ADC 113 comprises multiple, stacked analog-to-digital converters (ADC), each analog-to-digital converter converting the same analog input signal into a distorted digital signal but at time points that are offset from one another. In this manner, interleaved ADC 113 is characterized as producing a distorted digital output signal u(n) with a relatively high data rate while operating each individual ADC at a relatively low data rate, which is highly desirable.

However, it has been found that calibration inaccuracies commonly occur between the individual ADCs of an interleaved ADC, these calibration errors often arising from a variety of different sources, such as slightly different delays in the sample and hold subsystem, differences in the electrical distance and impedance for signal inputs, and/or differences in the processing time for the sample clock inputs. For example, if one ADC samples at time points which are slightly and consistently offset from the expected time points, as determined by the other ADCs in the system, a phase offset between the output signal from each ADC will be created. As can be appreciated, the creation of these types of calibration errors produces interleave distortion products in the interleaved signal u(n), which is highly undesirable Traditional means for remedying interleaved distortion products is through the self-calibration of each individual component in subsystem 113. As will be described in detail below, the present invention is designed to minimize the presence of interleaved distortion products generated by subsystem 113 by calibrating each individual component of subsystem 113 relative to one another (e.g., by assuming the signal generated by one component is the perfect, or ideal, reference signal and then, in turn, equalizing the signal generated by each of the other components to match the ideal reference signal). As can be appreciated, the general idea of calibrating the multiple components of subsystem 113 relative to one another, as opposed to the calibration of each component in isolation, serves as a fundamental novel feature of the present invention.

Equalization subsystem 115 is designed to minimize signal distortion products which are present in distorted output signal u(n). Because interleaved ADC 113 introduces both interleave and non-linear distortion products into its distorted digital output signal u(n), equalization subsystem 115 is preferably designed to treat both the interleave and nonlinear distortion products. For this reason, equalization subsystem 115 is also referred to herein as an interleave nonlinear equalizer (iNLEQ). It is to be understood that both the architecture of iNLEQ 115 as well as the methods for identifying the optimal substructure for iNLEQ 115 (including linear filter coefficients) serve as principal novel features of the present invention and, as such, will be described further in detail below.

Interleaved Nonlinear Equalizer (iNLEQ) Architecture

Figure 5:
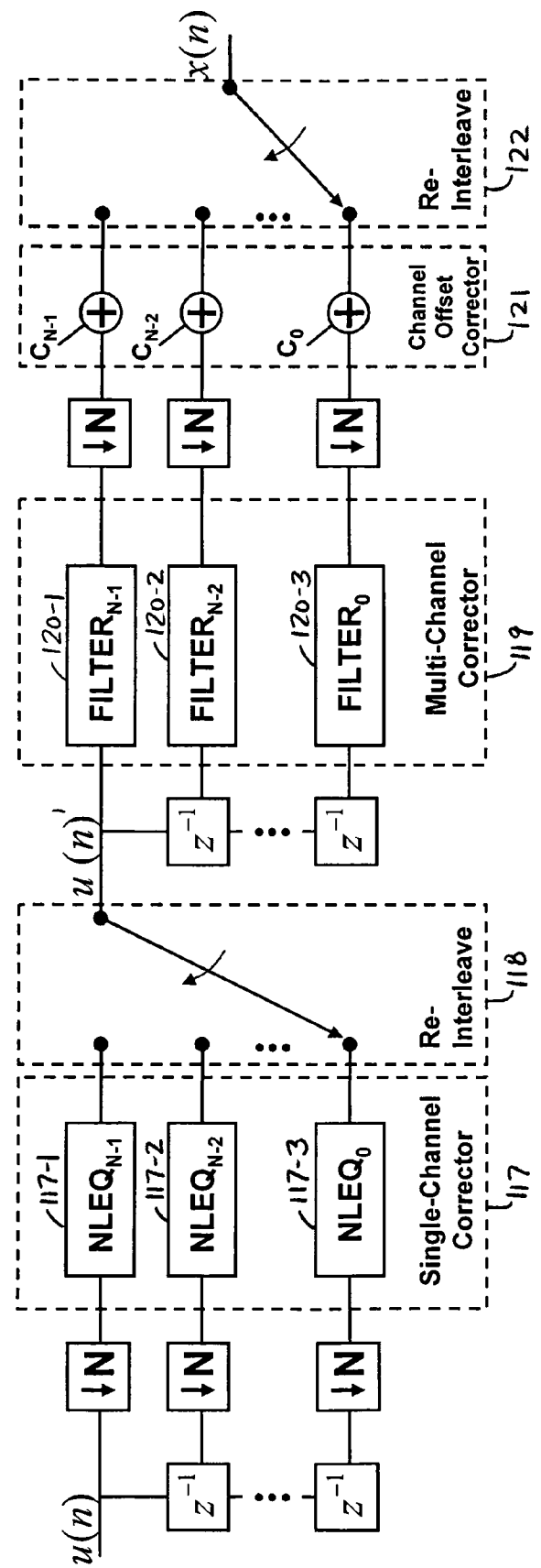
FIG. 5 is a simplified block diagram of first implementation of a generalized, N-channel representation of the architecture for the equalization subsystem shown in FIG. 4.

Referring now to FIG. 5, a generalized, N-channel representation of one possible implementation for the architecture for iNLEQ 115 is shown. It should be noted that the present invention is not limited to the particular architecture of iNLEQ 115 shown herein. Rather, it is to be understood that certain modifications could be made to iNLEQ 115 without departing from the spirit of the present invention. For instance, a number of more specific implementations of iNLEQ 115 could be designed to treat distortion products generated by particular types of interleaved ADCs, examples of said implementations to be described in detail below.

As can be seen, the full rate digitized signal u(n) is downsampled and split into N subchannels (with it preferably being known by the operator that the analog input signal was processed as N sub-channels, such as an N-channel ADC).

Each sub-channel, in isolation, may include unique signal distortions. Accordingly, each sub-channel of digitized signal u(n) is treated, in isolation of one another, by a single channel corrector 117 to remove these signal distortions which may, in turn, become a source of discrepancy between sub-channels when re-combined to create the complete-channel digital signal (i.e., thereby resulting in interleave distortion). Specifically, single-channel corrector 117 comprises a plurality of single-channel, low rate, digital signal equalization elements (represented herein as elements 117-1, 117-2 and 117-3), each equalization element being designed to treat signal distortions present within a corresponding low-rate sub-channel. It should be noted that each single-channel equalization element within corrector 117 is preferably in the form of any well-known digital signal equalizer that is designed to treat signal distortion products. For example, each equalization element may be in the form of the non-linear equalizers (NLEQs) disclosed in either the '537 patent, the '555 patent or the '470 application.

The low-rate corrected signals are then re-combined by a re-interleave 118 to create a full-rate, digital signal u(n)' which is passed at full rate, with all signal data points, into a multi-channel corrector 119. Multi-channel corrector 119 is preferably in the form of a bank of filters comprised of linear equalization filters, NLEQ structures, or both (said bank of filters being designated herein as filters 120-1, 120-2 and 120-3). As can be appreciated, each filter is designed to calibrate one sub-channel data stream from full-rate signal u(n)', with the eventual downsampling process removing signal points from each path that are not corrected by the designated filter for said path (i.e., the delay blocks ensure that the correct points are kept from each path). However, it is to be understood that all data points (i.e., full-rate data) are necessary to properly correct each sub-channel.

After complete-channel digital signal u(n)' is passed through the filters of multi-channel corrector 119, the filtered output signal is then downsampled into its various subchannels and a passed into a channel offset corrector 121. Specifically, a constant DC offset term is added to each path to eliminate spikes at boundaries of frequency regions (e.g., a 4-way interleaved 400 MHz bandwidth ADC system with DC channel mismatch will shown tonal spurs at the frequency region boundaries of 100 MHz, 200 MHz and 300 MHz). The resultant sub-channel signals are then re-combined by a re-interleave 122 to create the full-rate output signal x(n) with reduced interleave distortions.

As will be discussed further in detail below, each linear equalization filter 120 can be identified and optimized to produce a desired behavior within ADC system 111. In particular, it should be noted that, if linear filters are used for filters 120, the equalization coefficient for each filter 120 has a linear relationship with respect to distorted signal u(n) and equalized signal x(n). As a result, by establishing the optimized coefficient for each linear filter 120, signal distortions present in signal u(n) can be reduced using conventional mathematical filtering tools, such as least squares approximation. It should be noted that if a polynomial filter is used in place of each linear filter 120, a horizontal coordinate system (HCS) of the type described in the '470 application could be used to preserve a similar linear relationship for each polynomial filter with respect to distorted signal u(n) and equalized signal x(n).

As will be proven mathematically below, output signal x(n) is linearly dependent upon the coefficient of filters 120. This linear dependency is particularly useful in the context of identifying and tracking the value of said filter coefficients, since techniques for optimizing linear signals are readily available, well-researched and easy to use.

The mathematical display of the linear dependence of the equalization coefficient h for linear filters 120 with respect to both the distorted digital signal u(n) and the equalized output signal x(n) (which is represented herein as y(n)) follows herewith (and is similarly referenced in the '470 application):

The output of the general iNLEQ processor is $$y = \sum_{j=1}^{J} y^{(j)}. \tag{1}$$

Here $$y^{(j)}(n) = u^{(j)}(n)(x * h^{(j)})(n) \tag{2}$$

where * denotes the convolution operator. Let $U^{(j)}=\mathrm{diag}(u^{(j)})$ and $T^{(j)}[x]$ is the Toeplitz matrix whose first column is x with the number of columns commensurate with the length of the filter $h^{(j)}$. Then we rewrite (2) in vector-matrix form as $$y^{(j)}=U^{(j)}T^{(j)}[x]h^{(j)}. \tag{3}$$

Let us further denote $$U = [U^{(1)} \ldots U^{(J)}], \; T[x] = \begin{bmatrix} T^{(1)}[x] & & \\ & \ddots & \\ & & T^{(J)}[x] \end{bmatrix}, \tag{4}$$

$$h = \begin{bmatrix} h^{(1)} \\ \vdots \\ h^{(J)} \end{bmatrix}.$$

Then (1) is rewritten as $$y = UT[x]h, \quad (5)$$

which shows the linear dependence of the output on the filter coefficients.

Using the above-described principles, any interleave artifacts present in signal u(n) can be dramatically reduced in output signal y(n) by establishing the optimal coefficients h(k) for linear filters 120, said process for establishing the optimal coefficient for linear filters 120 to be described in detail below.

Alternative iNLEQ Architectures

Figure 6:
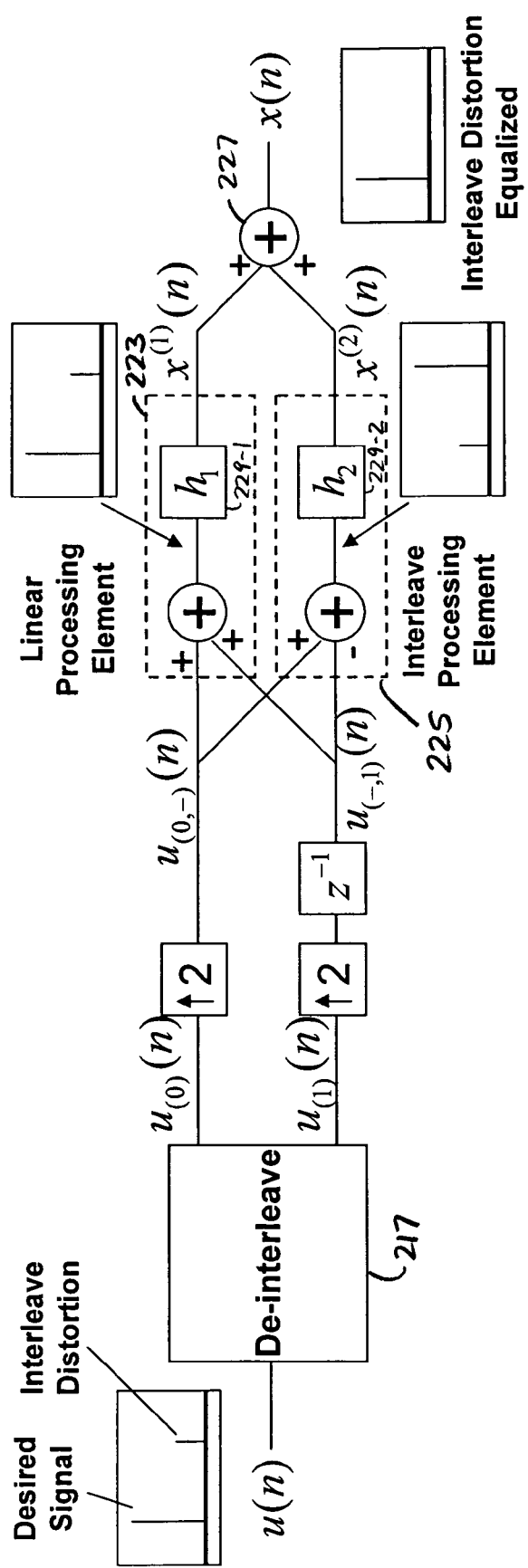
FIG. 6 is a simplified block diagram of a first implementation of a 2-channel representation of the architecture for the equalization subsystem shown in FIG. 4.

As noted briefly above, a number of more specific implementations of iNLEQ 115 could be designed to treat distortion products generated by particular types of interleaved ADCs. Referring now to FIG. 6, there is shown an interleaved nonlinear equalizer (iNLEQ) which has been specifically designed to treat distortion products generated by a 2-channel interleaved ADC, said iNLEQ being constructed according to the teachings of the present invention and identified generally by reference numeral 215.

As can be seen, iNLEQ 215 comprises a 2-way de-interleave 217 which partitions the digitized, multi-channel input signal(n) into first and second individual sub-channels $u_0(n)$ and $u_1(n)$ (i.e., input signal u(n) being split into its corresponding sub-channels by alternating sample points between signal $u_0(n)$ and $u_1(n)$). This results in the data rate for each of the first and second channels $u_0(n)$ and $u_1(n)$ decreasing by a factor of two. Once downsampled, each de-interleaved channel is then upsampled to full rate by inserting zeros and followed by at least at least one linear processing element 223 and at least one interleaved processing element 225, the respective outputs being summed together by means of a summation module 227 to yield the equalized, digital output signal x(n).

Each of processing elements 223 and 225 is provided with an equalization filter 229-1 and 229-2. For purposes of simplicity only, equalization filter 229 is described herein as being in the form of a linear finite-duration impulse response (FIR) filter. However, it is to be understood that equalization filter 229 may be in the form of alternative types of filters (e.g., an infinite impulse response (IIR), polynomial or non-polynomial) without departing from the spirit of the present invention.

In use, iNLEQ 215 is designed to minimize the presence of both non-linear and interleave distortion products in signal u(n) in the following manner. Specifically, as noted above, input signal u(n) is de-interleaved into a plurality of discrete into a plurality of discrete paths, or channels. Linear processing element 223 re-interleaves the de-interleaved input signal u(n) (i.e., by adding together the signals), with the re-interleaved signal including various interleave distortion products. Interleave processing element 225 provides access to the interleaved modality in signal u(n) by subtracting (rather than adding) the de-interleaved signal channels (e.g., $u_{int}(n) = u_{(0,-)}(n) - u_{(-,1)}(n)$). By downsampling the de-interleaved signal and then upsampling the signal by inserting zeros between the samples, a mirror image of the original signal is created across the center of the positive-half of the frequency spectrum. When performed across both channels of a de-interleaved signal, the process of summing the unsampled signals recreates the original signal because the frequency phase characteristics constructively combine in the correct frequency locations and destructively combine to annihilate the incorrect frequency image. Interleave distortions arise because the unsampled signals do not combine perfectly, thereby distorting the desired signal and allowing for an artifact of the incorrect image to remain. By subtracting the interleaving signals, the phase of the second signal is rotated 180°, thereby weakening the correct frequency image while strengthening the incorrect signal image. This results in a signal which strongly matches the interleave distortion artifact modality. iNLEQ 211 filters this signal and combines the result with the linearly re-interleaved signal treated to create equalized output signal x(n).

Figure 7:
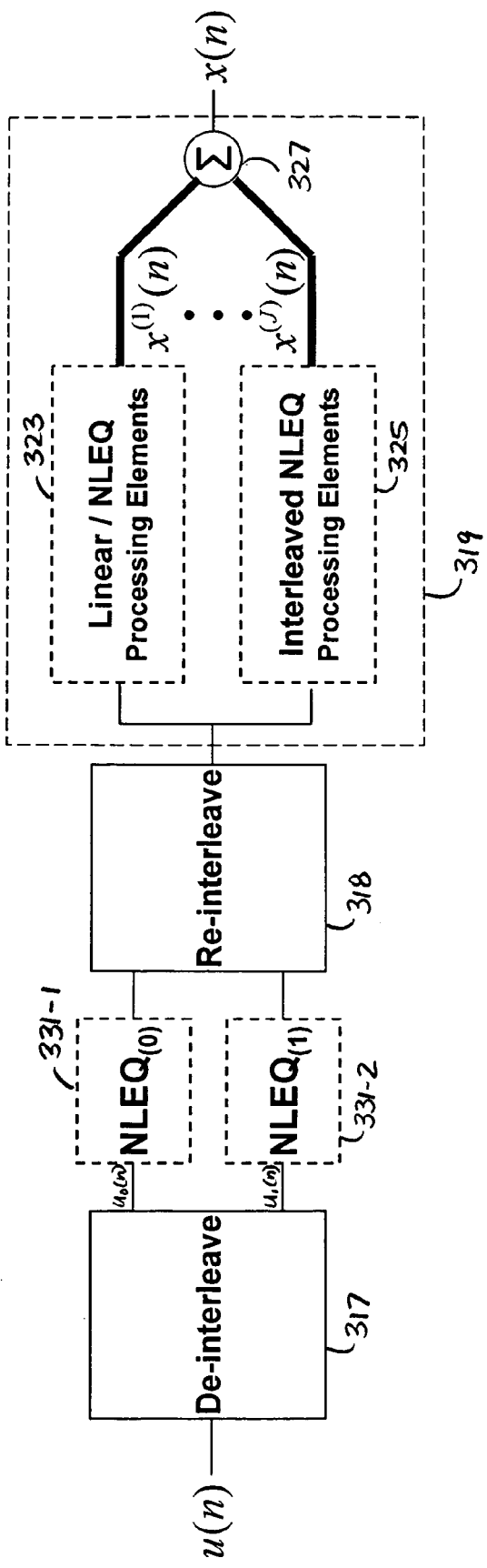
FIG. 7 is a simplified block diagram of a second implementation of a 2-channel representation of the architecture for the equalization subsystem shown in FIG. 4.

Referring now to FIG. 7, there is a simplified block diagram of another implementation of an interleaved nonlinear equalizer (iNLEQ) which is constructed according to the teachings of the present invention and identified generally by reference numeral 315. For purposes of simplicity only, iNLEQ 315 is represented in a simplified, or generalized, manner.

As can be seen, iNLEQ 315 is similar to iNLEQ 215 in that iNLEQ 315 comprises a de-interleave 317 for partitioning interleaved input signal u(n) into first and second sub-channels $u_0(n)$ and $u_1(n)$. The separate sub-channels of input signal u(n) are then combined by a re-interleave 318. The re-interleaved signal is then equalized by a multi-channel corrector 319 which includes a plurality of linear processing elements 323 and a plurality of interleave processing elements 325 which are summed together by a summation module 327 to yield the equalized, digital output signal x(n).

iNLEQ 315 differs from iNLEQ 215 in that iNLEQ 315 additionally comprises a pair of nonlinear equalizer (NLEQ) digital signal processing elements 331-1 and 331-2 that are situated between de-interleave 317 and re-interleave 318. As can be appreciated, each NLEQ 331 reduces non-linear distortion products present within first and second de-interleaved sub-channels $u_0(n)$ and $u_1(n)$, respectively.

Figure 8:
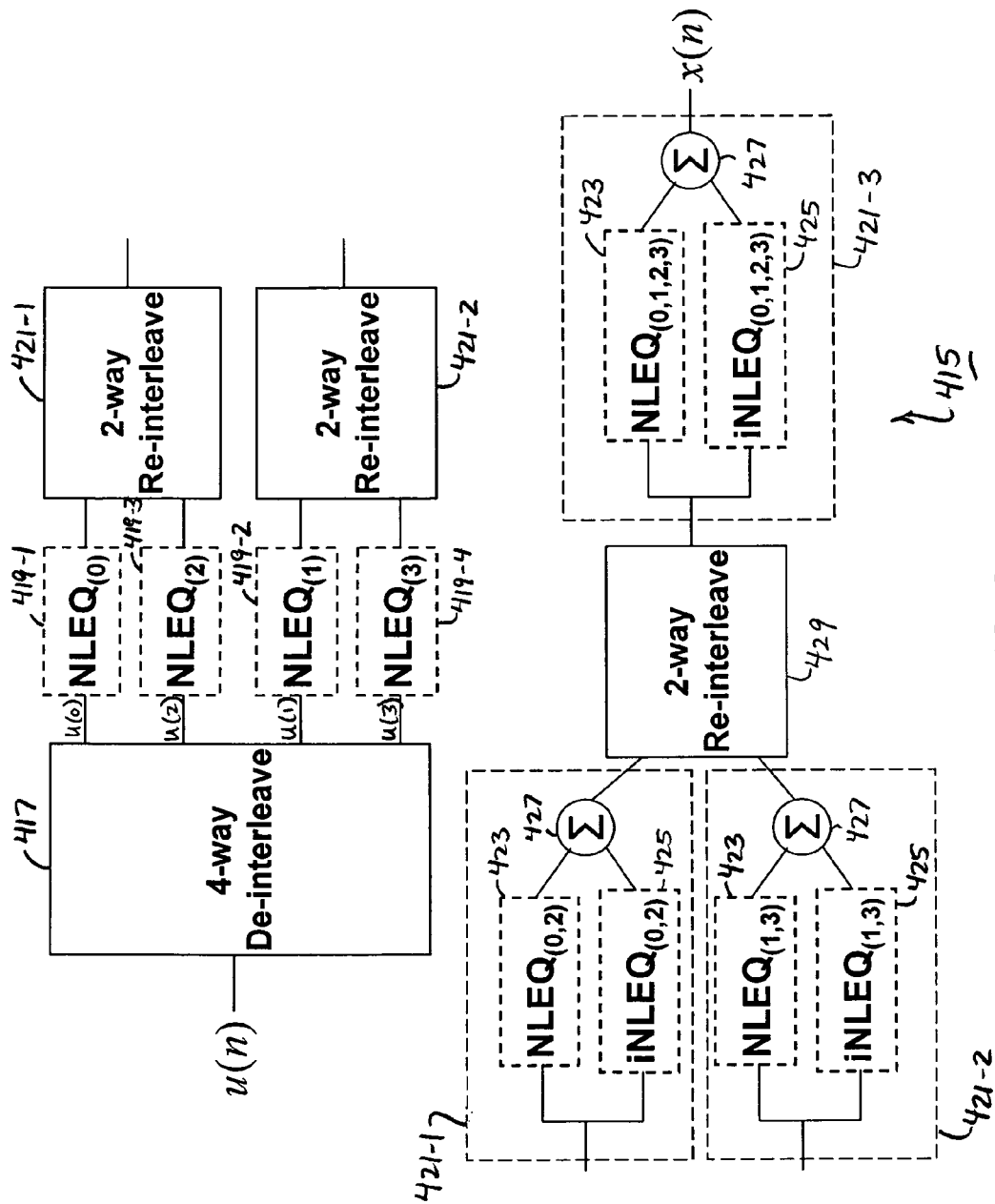
FIG. 8 is a simplified block diagram of a first implementation of a 4 channel representation of the architecture for the equalization subsystem shown in FIG. 4.

Specifically, referring now to FIG. 8, there is shown a simplified block diagram of another implementation of an interleaved nonlinear equalizer (iNLEQ) constructed according to the teachings of the present invention, the iNLEQ being identified generally by reference numeral 415.

As can be seen, iNLEQ 415 comprises a 2-stage, 4-way de-interleave 417 which de-interleaves interleaved input signal u(n) into a first pair of low-rate sub-channels u(0) and u(2) that are spaced evenly in phase and a second pair of low-rate sub-channels u(1) and u(3) that are spaced evenly in phase. A plurality of low-rate, single-channel nonlinear equalization elements 419-1 thru 419-4 are located after 4-way de-interleave 417 to remove signal distortions present within each sub-channel that may become a source of discrepancy between sub-channels when re-combined to create the full-rate complete-channel digital signal. The corrected pairs of low-rate sub-channels are then re-combined by a pair of 2-way re-interleaves 421-1 and 421-2.

The pair of medium-rate re-interleaved signals is then passed into medium-rate multi-channel correctors 421-1 and 421-2, respectively, each corrector 421 being similar in construction to multi-channel corrector 319 in iNLEQ 315. Specifically, each multi-channel corrector 421 includes linear processing elements 423 and interleaved processing elements 425 which are summed together by a summation module 427. The pair of resultant medium-rate output signals are then upsampled by a 2-way re-interleave 429. The full-rate complete-channel digital signal is then passed in its entirety, with all sub-channel data, into a third multi-channel corrector 421-3 which includes linear processing elements 423 and interleaved processing elements 425 summed together by a summation module 427 to yield equalized output signal x(n).

As can be seen, iNLEQ 415 utilizes three independent multi-channel correctors 421, operating at three different signal rates, to treat distorted input signal u(n). To optimize performance, each of the plurality of multi-channel correctors 421 is preferably independently designed (i.e., using a unique ideal signal to optimize the various filter coefficients), which is highly desirable.

Use of Linear Transformations to Reduce Interleave Distortion Products

It is further to be understood that the linear transformation of distorted, interleaved signal u(n) can be used to reduce interleave distortion products. In this manner, the linear transformation process effectively replaces the de-interleaving, upsampling and re-interleaving operations described above in connection with iNLEQ 215.

Figure 9:
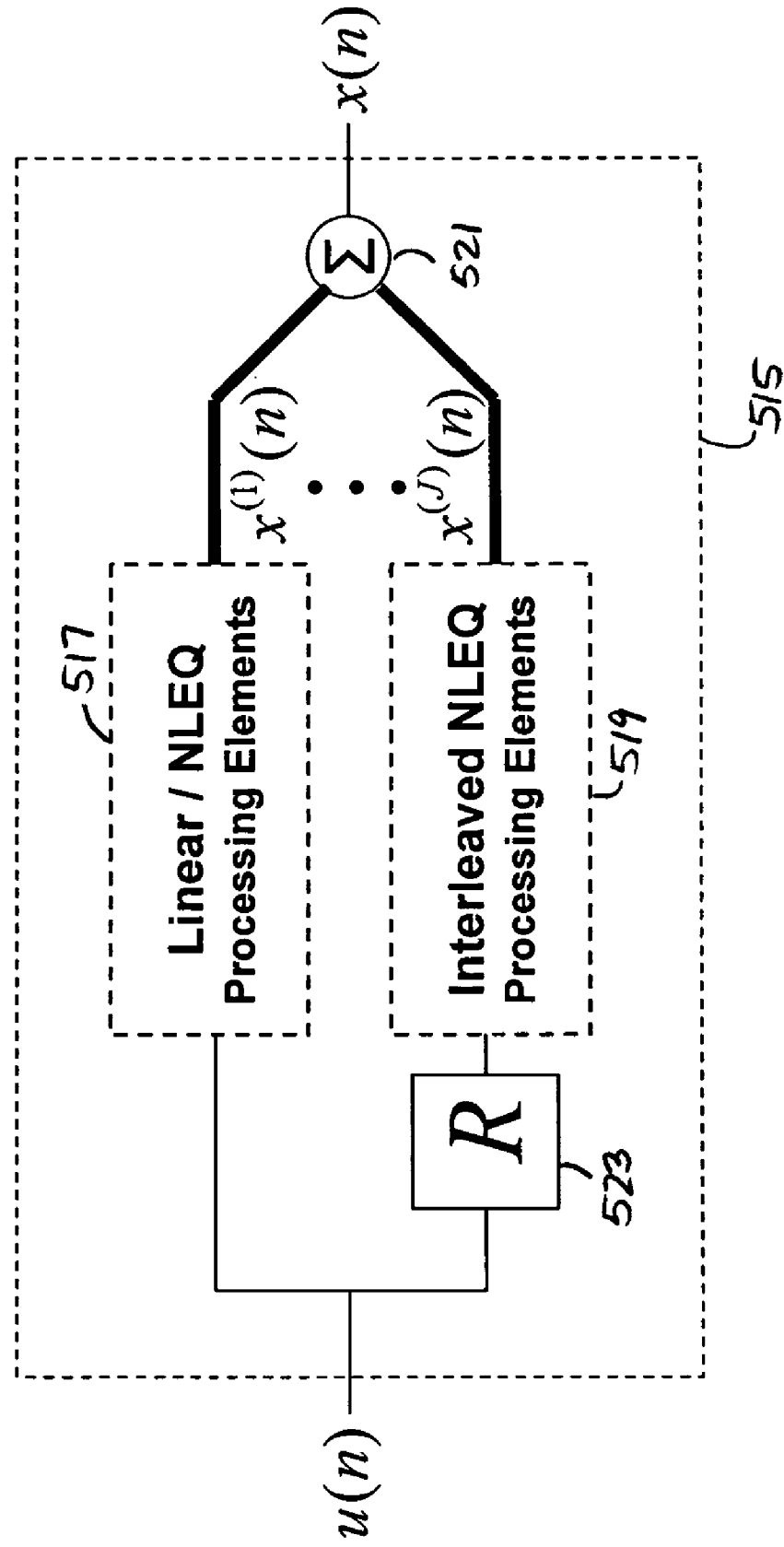
FIG. 9 is a simplified block diagram of a first implementation of the architecture for the equalization subsystem shown in FIG. 4 which utilizes linear transformation.

Specifically, referring now to FIG. 9, there is shown a simplified block diagram of another implementation of an equalization subsystem constructed according to the teachings of the present invention and identified generally by reference numeral 515. As can be seen, equalization subsystem 515 comprises a plurality of linear processing elements 517 and a plurality of interleave processing elements 519 which are summed together by a summation module 521 to yield the equalized, digital output signal x(n).

Equalization subsystem 515 additionally includes a linear transform 523 of the interleaved signal u(n) (e.g., in either the time-domain or frequency-domain). As noted briefly above, the linear transform of interleaved signal u(n) eliminates the need for the de-interleaving, upsampling and re-interleaving processes associated with iNLEQ 215. As a result, the utilization of equalization subsystem 515 to minimize the presence of interleaved defects may result in a more practically efficient implementation.

To understand how linear transformations can be used to reduce interleave distortion products, a pair of examples are provided below. For purposes of simplicity only, both examples assume that the distorted input signal u(n) is interleaved from two sources (e.g., a pair of analog-to-digital converters). However, it is to be understood that the principles described herein could be similarly applied to interleaved signals derived from additional sources.

Figure 10:
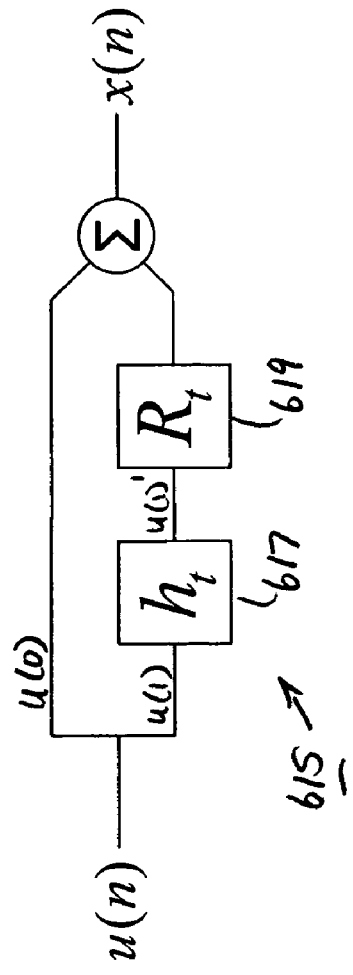
FIG. 10 is a simplified block diagram of a second implementation of the architecture for the equalization subsystem shown in FIG. 4 which utilizes linear transformation.

In the first example, a linear transform of interleaved input signal u(n) is undertaken from a time-domain perspective. Referring now to FIG. 10, there is shown a simplified block diagram of the filter architecture for an equalization subsystem 615 that is designed to calibrate an interleaved signal u(n). In the present example, the interleaved signal u(n) is split into its two source signals u(0) and u(1). Without loss of generality, the signal u(0) is assumed to be the ideal reference signal and signal u(1) is assumed to introduce the source of calibration errors.

Since signal u(0) is assumed to be the ideal reference signal, signal u(0) is not subjected to either of the transformation and filtering processes (as shown herein). Rather, it is to be understood that the equalization of interleave distortions is accomplished by matching signal u(1) to ideal signal u(0).

Accordingly, signal u(1) is shown subjected to a linear filter 617 to yield a filtered signal u(1)'. Because it is desired to alter signal u(1) to match ideal signal u(0), a linear transformation 619 of the filtered signal u(1)' is performed to extract the desired component from said signal. The transformation matrix $R_t$ used to extract the desired signal from the output of the equalization filter 617 can be represented as such:

$$R_t = \begin{bmatrix} 0 & & & \\ & 1 & & \\ & & 0 & \\ & & & 1 \\ & & & & \ddots \end{bmatrix}, \quad (6)$$

which incorporates the upsampling function from the system diagrams. Letting $u = [u(1)\ u(2)\ \ldots]^T$ and $x = [x(1)\ x(2)\ \ldots]^T$ be the vector-matrix representation for u(n) and x(n), and the L-length filter be described by $$h_t = \begin{bmatrix} h_t(1) & \ldots & h_t(L) & & \\ & h_t(1) & \ldots & h_t(L) & \\ & & h_t(1) & \ldots & h_t(L) \\ & & & & \ddots \end{bmatrix} \quad (7)$$

the equalizer function becomes $$x = (I + R_t h_t)u = S_t u \quad (8)$$

where $$S_t = I + R_t h_t$$
$$= \begin{bmatrix} 1 & 0 & 0 & & & \\ & 1 + h_t(1) & h_t(2) & \ldots & & \\ & & 1 & 0 & 0 & \\ & & & 1 + h_t(1) & h_t(2) & \ldots \\ & & & & & \ddots \end{bmatrix}.$$

Clearly, the filter $S_t$ appears as an identity function to the ideal signal u(0) and only applies linear filter 617 to second interleaved signal u(1), with the first interleaved signal u(0) passing directly to the output summation. As such, subsystem 615 has the capability to adjust for the calibration error present in the incorrectly interleaved signal u(1).

Figure 11:
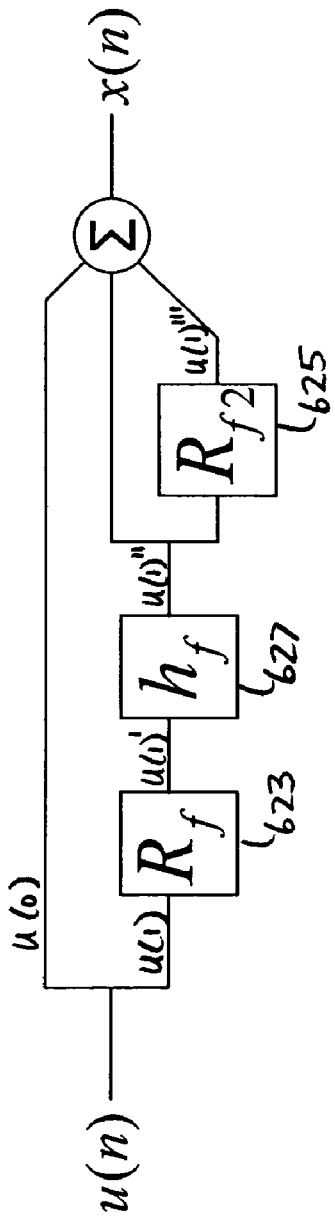
FIG. 11 is a simplified block diagram of a third implementation of the architecture for the equalization subsystem shown in FIG. 4 which utilizes linear transformation.

In the second example, a linear transform of interleaved input signal u(n) is undertaken from a frequency-domain perspective. Referring now to FIG. 11, there is shown a simplified block diagram of the filter architecture for an equalization subsystem 621 that can be used to treat interleaved signal u(n). In the present example, the interleaved signal u(n) is split into its two source signals u(0) and u(1). Without loss of generality, the signal u(0) is assumed to be the ideal reference signal and signal u(1) is assumed to introduce the source of calibration errors.

Once again, since signal u(0) is assumed to be the idea reference signal, signal u(0) is not subjected to the transformation and filtering processes and, as a result, passes directly to the output summation. Rather, it is to be understood that the equalization of interleave distortions is accomplished by matching signal u(1) relative to ideal signal u(0).

Accordingly, signal u(1) is shown subjected to a first and second linear transformations 623 and 625 to generate a signal with a strong correlation to the frequency components of the interleaving distortions. Specifically, the primary transformation matrix $R_f$ can be represented as such:

$$R_f = \begin{bmatrix} 1 & & & & \\ & -1 & & & \\ & & 1 & & \\ & & & -1 & \\ & & & & \ddots \end{bmatrix}. \quad (9)$$

The primary transformation of signal u(1) yields a transformed interleaved signal u(1)' which is then filtered by an equalization filter 627 to counteract the interleave distortion which appears out-of-band in the interleaved signal u(n). This, however, leaves in-band distortion in the filtered signal u(1)''. Accordingly, to apply a similar compensation to the in-band signal, filtered signal u(1)'' is passed through secondary transformation 625. The secondary transformation matrix $R_{f2}$ can be represented as such:

$$R_{f2} = \begin{bmatrix} -1 & & & & \\ & 1 & & & \\ & & -1 & & \\ & & & 1 & \\ & & & & \ddots \end{bmatrix} \quad (10)$$

The output from the secondary transformation generates a commensurate compensation signal u(1)''' in the in-band frequency locations which is then added to the output signal u(1)'' from equalization filter 627 to create the full compensation signal. Adding the full compensation signal to the ideal signal u(0) thus produces compensated output signal x(n). Accordingly, system 511 can be represented as such:

$$\begin{aligned} x &= u + h_f R_f u + R_{f2} h_f R_f u \\ &= ([I + R_{f2}] h_f R_f + I) u \\ &= S_f u, \end{aligned} \quad (11)$$

where $$\begin{aligned} S_f &= [I + R_{f2}] h_f R_f + I \\ &= \begin{bmatrix} 0 & 0 & 0 & & & \\ -2h_f(1) & 2h_f(2) & -2h_f(3) & \cdots & \\ & 0 & 0 & 0 & \\ & & -2h_f(1) & 2h_f(2) & \\ & & & & \ddots \end{bmatrix} + I \\ &= \begin{bmatrix} 1 & 0 & 0 & & & \\ 1-2h_f(1) & 2h_f(2) & -2h_f(3) & \cdots & \\ & 1 & 0 & 0 & \\ & & 1-2h_f(1) & 2h_f(2) & \\ & & & & \ddots \end{bmatrix}. \end{aligned}$$

The linear transformation $S_f$ appears as an identity operator to the already-perfect input signal u(0), and provides a filtering operation to compensate for the interleave error in u(1). It should be noted that resulting transformations $S_t$ and $S_f$ have an identical form, and differ only by the designation of the filter coefficients. This shows that despite the fact that filter architecture 615 provides access to only one of the interleaved signals, and the filter architecture 621 provides access to the interleave artifact frequency image, the same equalization function is provided.

Identification of Optimal Equalization Filter Coefficients

Before any of the above-described signal equalizers (e.g., equalization subsystem 115) can be used to minimize interleaved distortion products present in digital signal u(n), it is to be understood that the optimal (or near-optimal) coefficient value for each linear filter (e.g., filters 120-1 thru 120-3) needs to be calculated (i.e., as part of an initial set-up process). The particular method for identifying the optimized equalizer coefficients is described in detail below in conjunction with signal processing system 111. It is to be understood that said method has novel aspects which yield a number of notable benefits and, as such, serves as a principal novel feature of the present invention.

As the first step in the optimization process, one or more sets of known analog excitation signals are injected into multi-channel subsystem 113 (e.g., from a test signal generator). It should be noted that the purpose of the excitation signal is to adequately excite interleave modalities from multi-channel subsystem 113 which correspond to the band of interest for input signals (the bandwidth being chosen by the designer). Preferably, the excitation signals are multi-tone (sinusoidal) signals. As can be appreciated, tones are advantageous in that they (i) are easily separable in frequency, (ii) enable a large number of data points to be recorded and averaged down to a smaller number of data points with a reduced noise floor (the reduced noise floor, in turn, providing access to distortion components that may otherwise be hidden), and (iii) can be used to excite polynomial distortions that may be present.

It should be noted that in the case of an equalization subsystem which includes both single-channel correction means (e.g., corrector 117) and a multi-channel correction means (e.g., corrector 119), it is possible to use a single set of excitation signals and their corresponding outputs to identify all filter coefficients. However, in this case, the requirements for said set of signals are more demanding since both nonlinear and interleave modalities require excitation.

The distorted output signal u(n) produced by subsystem 113 in response to the aforementioned set of analog excitation signals is then measured and analyzed using application-specific data processing equipment (e.g., a personal computer). In response thereto, the data processing equipment utilizes the recorded data and the excitation signal parameter information to digitally generate "ideal" signals which are, in turn, used by said processing equipment to select optimized values for the equalizer coefficients for each filter (e.g., filter 120) using conventional techniques, as will be described further below.

It should also be noted that in the case of an equalization subsystem which includes both single-channel correction means (e.g., corrector 117) and a multi-channel correction means (e.g., corrector 119), the creation of an "ideal" signal for calculating all filter coefficients is rendered significantly more complicated.

Accordingly, in the present invention, it is recommended that the ideal full rate signal (also referred to herein simply as the "ideal signal") be selected using either: (a) a fabricated digital signal created using known training signal parameters; or (b) one of the existing sub-channels produced from the de-interleave of signal u(n) (e.g., either signal $u_{(0)}(n)$ or $u_{(1)}(n)$ in FIG. 6), said signal being further upsampled and interpolated to ensure the signal is in the correct frequency zone.

If one of the existing sub-channels is utilized as the ideal signal, it is to be understood that the filters or equalizers assigned to the remaining de-interleaved sub-channels (i.e., N−1 sub-channels) are then designed to produce an output signal which matches the ideal signal channel. Specifically, the filter coefficients for the remaining N−1 "errant" channels are identified using the chosen ideal signal, downsampled to the corresponding sub-channel data, as the "target" output. Standard filter design techniques, such as least squares, can be used to calculate these filter coefficients.

Specifically, as noted above, because the equalizer coefficients have a linear relationship with respect to both distorted digital signal u(n) and equalized output signal x(n), the data processing equipment can perform the necessary equalizer identification calculations using traditional linear mathematical tools which are both well-defined and of limited complexity, which is highly desirable. For example, the identification process may be accomplished using either a least-squares optimal filter design or a more complicated polynomial filter design (if harmonic effects are present), both techniques being described in detail in the '537 patent and the '470 application.

It is to be understood that the filter coefficients for each of the linear transform examples described in detail above can be calculated in the following manner.

With respect to the equalization subsystem 615 shown in FIG. 10, if $\hat{x}$ is the ideal output from system 615, the optimized coefficient for filter 617 can be determined in the following manner:

$$\underset{h}{\mathrm{argmin}} \|x - \hat{x}\| \tag{12}$$

Based on previous calculations for system 615, x can be represented as:

$$x = (I + R_t h_t) u \tag{13}$$

and the minimization can be found by solving the following equation for $h_t$:

$$\hat{x} = u + R_t h_t u \tag{14}$$

This in turn leads to the following:

$$\hat{x}(n) - u(n) = R_t(n, n)[u(n)\ u(n-1)\ \ldots\ u(n-L+1)] \begin{bmatrix} h_t(1) \\ \vdots \\ h_t(L) \end{bmatrix}. \tag{15}$$

Letting $\underline{u}(n) = [u(n)\ u(n-1)\ \ldots\ u(n-L+1)]^H$, $$\begin{bmatrix} \hat{x}(n) \\ \hat{x}(n+1) \\ \vdots \end{bmatrix} - \begin{bmatrix} u(n) \\ u(n+1) \\ \vdots \end{bmatrix} = R_t \begin{bmatrix} \underline{u}(n)^H \\ \underline{u}(n+1)^H \\ \vdots \end{bmatrix} \begin{bmatrix} h_t(1) \\ \vdots \\ h_t(L) \end{bmatrix}$$

$$= \begin{bmatrix} 0 \\ \underline{u}(n+1)^H \\ 0 \\ \underline{u}(n+3)^H \\ \vdots \end{bmatrix} \begin{bmatrix} h_t(1) \\ \vdots \\ h_t(L) \end{bmatrix}.$$

Applying a downsampling function $D_s$ gives $$D_s[\hat{x} - u] = D_s \begin{bmatrix} 0 \\ \underline{u}(n+1)^H \\ 0 \\ \underline{u}(n+3)^H \\ \vdots \end{bmatrix} \begin{bmatrix} h_t(1) \\ \vdots \\ h_t(L) \end{bmatrix}$$

$$= \begin{bmatrix} \underline{u}(n+1)^H \\ \underline{u}(n+3)^H \\ \vdots \end{bmatrix} \begin{bmatrix} h_t(1) \\ \vdots \\ h_t(L) \end{bmatrix}$$

$$= T_t[u(n)] h_t.$$

Solving for $h_t$ results in:

$$h_t = (T_t^H T_t)^{-1} T_t D_s[\hat{x} - u]. \tag{16}$$

With respect to the equalization subsystem 621 shown in FIG. 11, $\hat{x}$ is once again assigned as the ideal output. Because the output of equalization filter 627 alone compensates for the interleave distortion present in $\hat{x}$, only this signal is needed for coefficient identification, and the secondary transformation 625 can be ignored when identifying filter h(f). Accordingly, the optimized coefficient for filter 627 can be determined in the following manner:

$$\underset{h}{\mathrm{argmin}} \|x - \hat{x}\| \tag{17}$$

Based on previous calculations for subsystem 621 and ignoring the secondary transformation branch, x can be represented as:

$$x = (I + R_f h_f) u \tag{18}$$

and the minimization can be found by solving the following equation for $h_f$:

$$\hat{x} = u + R_f h_f u \tag{19}$$

This in turn leads to the following:

$$\hat{x}(n) - u(n) = R_f(n, n)[u(n)\ u(n-1)\ \ldots\ u(n-L+1)] \begin{bmatrix} h_f(1) \\ \vdots \\ h_f(L) \end{bmatrix}. \tag{20}$$

Letting $\underline{u}(n) = [u(n)\ u(n-1)\ \ldots\ u(n-L+1)]^H$, $$\begin{bmatrix} \hat{x}(n) \\ \hat{x}(n+1) \\ \vdots \end{bmatrix} - \begin{bmatrix} u(n) \\ u(n+1) \\ \vdots \end{bmatrix} = R_f \begin{bmatrix} \underline{u}(n)^H \\ \underline{u}(n+1)^H \\ \vdots \end{bmatrix} \begin{bmatrix} h_f(1) \\ \vdots \\ h_f(L) \end{bmatrix}.$$

Since $R_f R_f = I$, $$R_f[\hat{x} - u] = \begin{bmatrix} \underline{u}(n)^H \\ \underline{u}(n+1)^H \\ \underline{u}(n+2)^H \\ \vdots \end{bmatrix} \begin{bmatrix} h_f(1) \\ \vdots \\ h_f(L) \end{bmatrix}$$

$$= T_f[u(n)] h_f.$$

Solving for $h_f$ results in:

$$h_f = (T_f^H T_f)^{-1} T_f^H R_f[\hat{x} - u]. \tag{21}$$

It is to be understood that, even after the initial "factory" setting of the equalizer coefficients as described above, each equalizer can be used to effectively track whether the equalization coefficients effectively maintain their optimized setting. In particular, it should be noted that various external conditions (e.g., thermal fluctuations, aging, radiation damage, etc.) can compromise the effectiveness of the initial coefficient calculation process. As a result, a secondary, or "tracking-based", optimization process can be undertaken using similar techniques as described above to update the equalizer coefficients to their most optimized state.

In a similar manner, when adaptive or a priori knowledge of a particular signal or distortion sub-space is known, this external knowledge may be similarly used to update the optimized coefficient values for each equalizer.

Measured Results

It should be noted that actual performance results have been measured with respect to iNLEQ 315 and are set forth in detail below. However, it is to be understood that the following results are being provided herewith for illustrative purposes only and are no way intended to limit the scope of the present invention.

Referring now to FIGS. 12(a)-(c), there is shown a first series of graphical representations which are useful in illustrating actual results achieved using a signal equalizer of the type as described in detail above (e.g., iNLEQ 315). In FIG. 12(a), there is shown a graphical representation of a distorted output signal being produced by a high speed interleaved ADC (of the type constructed by National Semiconductor Corporation of Santa Clara, Calif.) in response to a single tone input signal 711 within the band region of approximately 570 MHz to 590 MHz. Using five training signals within the same band, the optimized filter coefficients for iNLEQ 315 are calculated using optimization techniques described in detail above. As can be seen, the interleaved ADC is responsible for producing both non-linear artifacts 713-1 and interleave artifacts 713-2.

In FIG. 12(b), there is shown a graphical representation of the distorted output signal after having been treated for non-linear irregularities by NLEQ elements 331-1 and 331-2. As can be seen, NLEQ elements 331-1 and 331-2 significantly reduce the size of non-linear artifacts 713-1. However, it should be noted that at least one significant interleave artifact 713-2 remains, thereby limiting the overall dynamic range of the system.

Accordingly, in FIG. 12(c), there is shown a graphical representation of the distorted output signal of FIG. 12(b) after having been equalized by multi-channel corrector 319. As can be seen, corrector 319 reduces interleaved artifact 713-2 by approximately 20 db, the overall dynamic range improvement generated by iNLEQ 315 measuring at approximately 15 db, which is highly desirable.

Figure 13C:
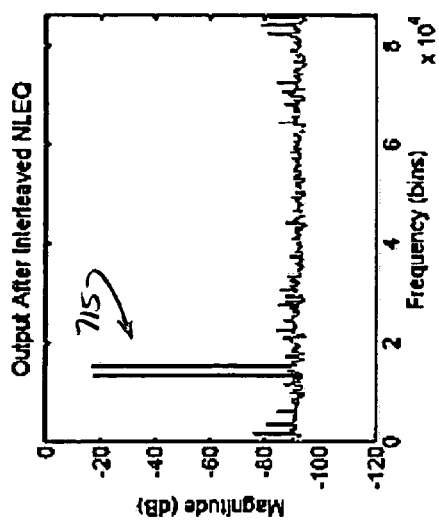
FIGS. 13 (a)-(c) depict a second series of graphical representations of a sample signal shown at various times during its transmission through the equalization subsystem shown in FIG. 7, said graphical representations being useful in displaying the benefit of applying multi-channel correction techniques to an interleaved signal.
Figure 13B:
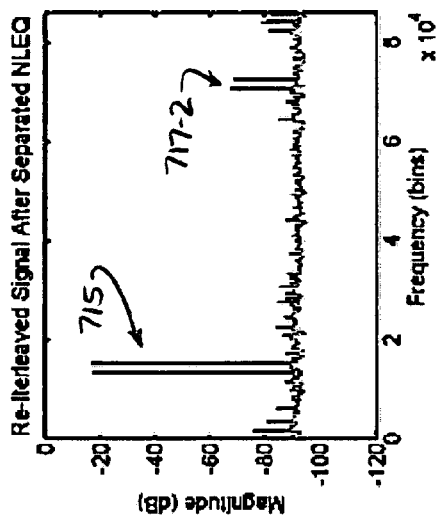
Figure 13A:
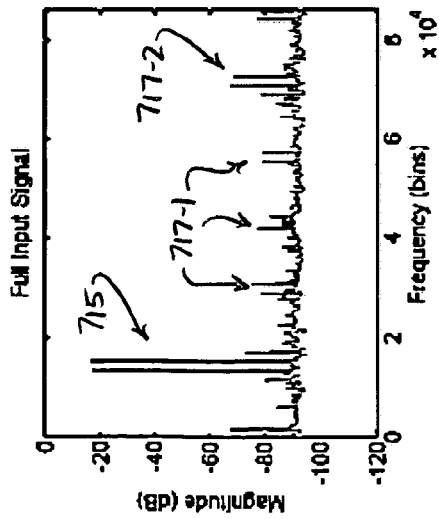

Referring now to FIGS. 13(a)-(c), there is shown a second series of graphical representations which are useful in illustrating actual results achieved using a signal equalizer of the type as described in detail above (e.g., iNLEQ 315). In FIG. 13(a), there is shown a graphical representation of a distorted output signal being produced by the same high speed interleaved ADC in response to a three tone input signal 715 within the band region of approximately 890 MHz to 910 MHz. Using six training signals within the same band, the optimized filter coefficients for iNLEQ 315 are calculated using optimization techniques described in detail above. As can be seen, the interleaved ADC is responsible for producing both non-linear artifacts 717-1 and interleave artifacts 717-2.

In FIG. 13(b), there is shown a graphical representation of the distorted output signal after having been treated for non-linear irregularities by NLEQ elements 331-1 and 331-2. As can be seen, NLEQ elements 331-1 and 331-2 significantly reduce the size of harmonic distortions 717-1. However, it should be noted that at least one significant interleave artifact 717-2 remains, thereby limiting the overall dynamic range of the system.

Accordingly, in FIG. 13(c), there is shown a graphical representation of the distorted output signal of FIG. 13(b) after having been equalized by multi-channel corrector 319. As can be seen, corrector 319 reduces interleaved artifact 717-2 by approximately 15 db, thereby significantly improving the overall dynamic range of iNLEQ 315, which is highly desirable.

Additional Applications for System 11

As noted above, system 11 has numerous applications in the signal processing industry. As described above, system 11 can be applied to ADC systems to calibrate interleaved signals. As an additional application, it is to be understood that system 11 could be applied to receiver arrays to treat spatial and electronic distance calibration errors.

Figure 14:
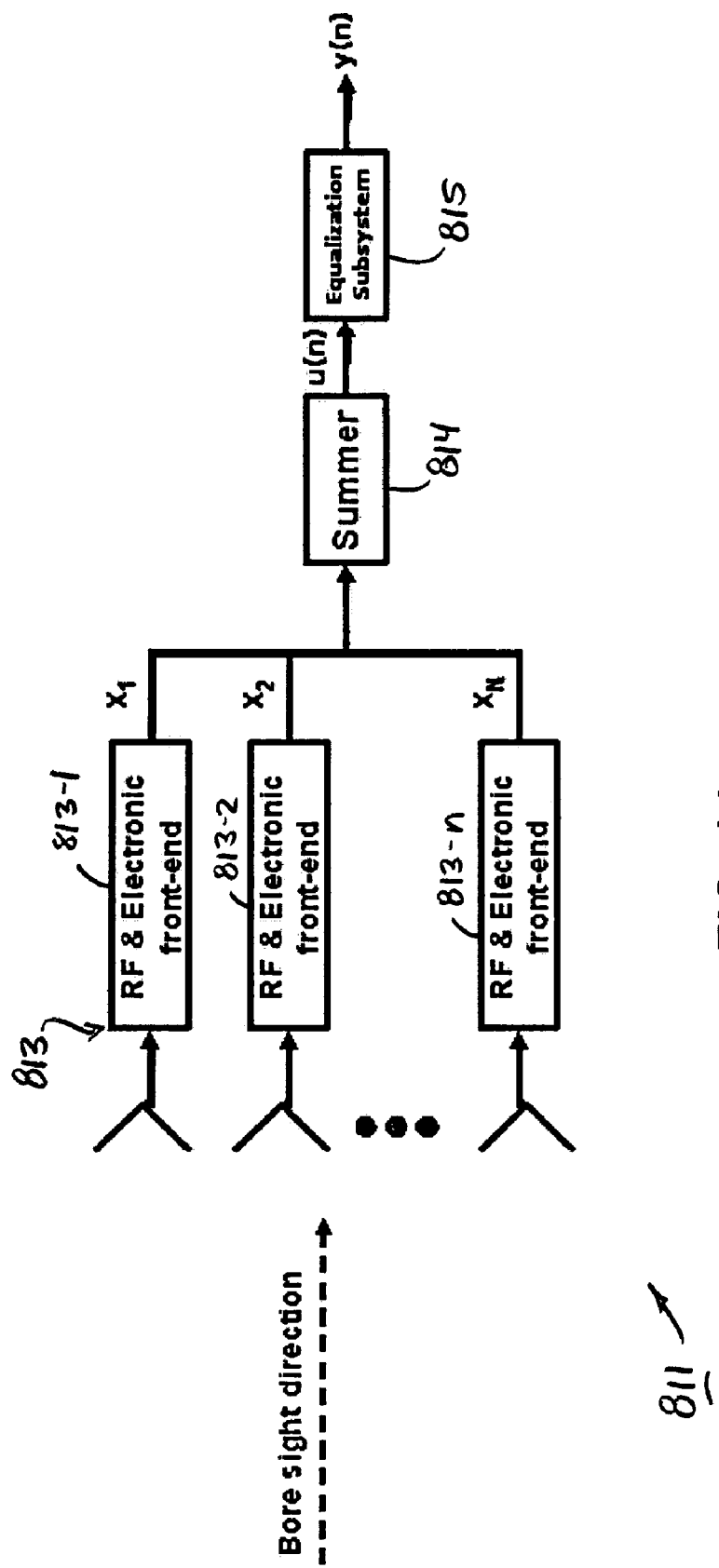
FIG. 14 a simplified block diagram of a receiver array-specific version of a signal processing system constructed according to the teachings of the present invention.

Specifically, referring now to FIG. 14, there is shown a signal processing system constructed according to the teachings of the present invention and identified generally by reference numeral 811. As will be described further below, system 811 applies the calibration methods described in detail above in conjunction with system 11 to spatial and electronic distance and amplitude calibration.

Specifically, as can be seen, system 811 comprises an array of individual receivers 813-1, 813-2 thru 813-$n$ which together create a receiver array 813. As can be seen, each receiver in array 813 includes an antenna for receiving an input signal and a front end device for conditioning said input signal so as to yield a conditioned signal $x_i$. The plurality of conditioned signals are then summed together by a summer 814 to yield distorted signal u(n).

It is to be understood that, due to the inherent properties of its design, receiver array 813 experiences considerably more gain in signal to noise ratio (SNR) than a single element receiver, which is highly desirable. However, if the relative calibration of the individual elements in a receiver array is less than perfect, the gain in SNR is significantly lowered. Accordingly, an equalization subsystem 815 is provided to treat, inter alia, spatial and electronic distance and amplitude (SEDA) calibration errors associated with signal u(n) and thereby yield a calibrated output signal y(n). It is to be understood that the general architecture for device 815 may resemble the architecture of equalization subsystem 15 shown in FIG. 3.

With respect to normal calibration errors (i.e., spatial discrepancies normal to the plane and electronic distance discrepancies), device 815 is designed to treat said calibration errors by selecting one signal $x_i$ received by a particular element (e.g., signal $x_1$ received by element 813-1) as the correct signal and, in turn, ascribing all discrepancies to the non-selected elements using the linear and non-linear correction techniques described in detail above in conjunction with system 111. It should be noted that the calibration process can be undertaken either (i) as part of a single calibration group (i.e., as a single calibration process) or (ii) as part of multiple, smaller calibration groups which are then in turn calibrated relative to one another until the entire array is calibrated. It should also be noted that large SNR signals and known signal patterns are preferred as calibration signals.

With respect to lateral calibration errors, it is once again to be understood that device 815 is designed to treat said calibration errors by selecting one signal $x_i$ received by a particular element (e.g., signal $x_1$ received by element 813-1) as the correct signal and, in turn, ascribing all discrepancies to the non-selected elements using the linear and non-linear correction techniques described in detail above in conjunction with system 111. As can be appreciated, it is preferred that the signal used to optimize the filter coefficients for device 815 be well off bore sight so that its lateral component depends on the angle. In fact, the calibration of signal u(n) may be accomplished simultaneously through a judicious choice of multiple sources. For example, the bore sight signals and the off bore sight signals can be orthogonal in frequency or any other temporal spectral decomposition.

With respect to amplitude and phase calibration errors, it is yet again to be understood that device 815 is designed to treat said calibration errors by selecting one signal $x_i$ received by a particular element (e.g., signal $x_1$ received by element 813-1) as the correct signal and, in turn, ascribing all discrepancies to the non-selected elements using the linear and non-linear correction techniques described in detail above in conjunction with system 111. As can be appreciated, it is preferred that multiple sources from many angles relative to the array bore sight be used to optimize the filter coefficients for device 815.

Use of Identified Interleaved Distortion Products to Treat Aliasing and Ambiguity Problems The present invention proposes that calibration distortion created by multi-component subsystems be used to treat problems which commonly arise from low rate sampling. In this manner, it is proposed that a high performance, low cost, sub-Nyquist receiver could be practically implemented, which is highly desirable.

In some circumstances, it is possible to sample a signal below the traditional Nyquist rate and later recover the information from the signal through digital post-processing. A signal that occupies only a small portion of a wide bandwidth, a sparse signal, may be undersampled and reconstructed in this fashion. The '555 patent provides an example of an undersampling technique for sparse signals. This allows lower-speed, lower-power and more accurate equipment to be used, which is highly desirable.

It is known in the art that when the sampling rate chosen for a device is too low, aliasing may occur in a signal output therefrom. Simply stated, aliasing relates to both: (i) the loss of some frequencies of an original signal when sampled at a slow rate and (ii) the generation of frequency-shifted replicas of a target signal when the digitized signal is reconstructed as a continuous time signal. As will be shown in detail below, signal replicas caused from aliasing often create ambiguities and/or mixing with the target signal, which is highly undesirable.

For example, when a signal is undersampled in the frequency domain by a factor of 8, all of the signal information in the initial spectrum is folded down into a new spectrum that is 1/8th the size of the original spectrum. It is assumed that the signal herein is sufficiently sparse (i.e., that the portion of the signal containing meaningful information is smaller than the undersampling bandwidth, in this case 1/8th the full-rate bandwidth). Subsequent upsampling can be used to expand the signal but will not provide any new information because, in the frequency domain, the signal folded into the lowest 1/8th of the spectrum is unfolded with identical copies appearing in the seven re-generated frequency zones. As a result, there is no way to discern the original signal from the seven new ambiguous signals (i.e., there is no signal diversity).

Extending the aforementioned example to the present invention, it is proposed that only six data points be discarded from the undersampled signal (i.e., rather than seven). As a result, two sets of undersampled signals can be de-interleaved from the resulting signal. Re-interleaving the two signals at the full rate provides more information in both the time domain and the frequency domain. The result is that the eight previously ambiguous images created during wideband reconstruction are no longer identical because the phase offsets imparted by upsampling the different downloaded samples are added together to give a new amplitude and phase characteristic to the frequency images.

Most notably, when two samples are retained, the frequency images beyond the downsampled region are rendered unique, thereby indicating that extra information (interleaving distortions) has been phase encoded in the difference between the two signals. Therefore, by carefully selecting the two signals to retain as part of the initial downsampling process, the interleaving distortion created therefrom can be used for phase encoding aliased images.

Figure 15:
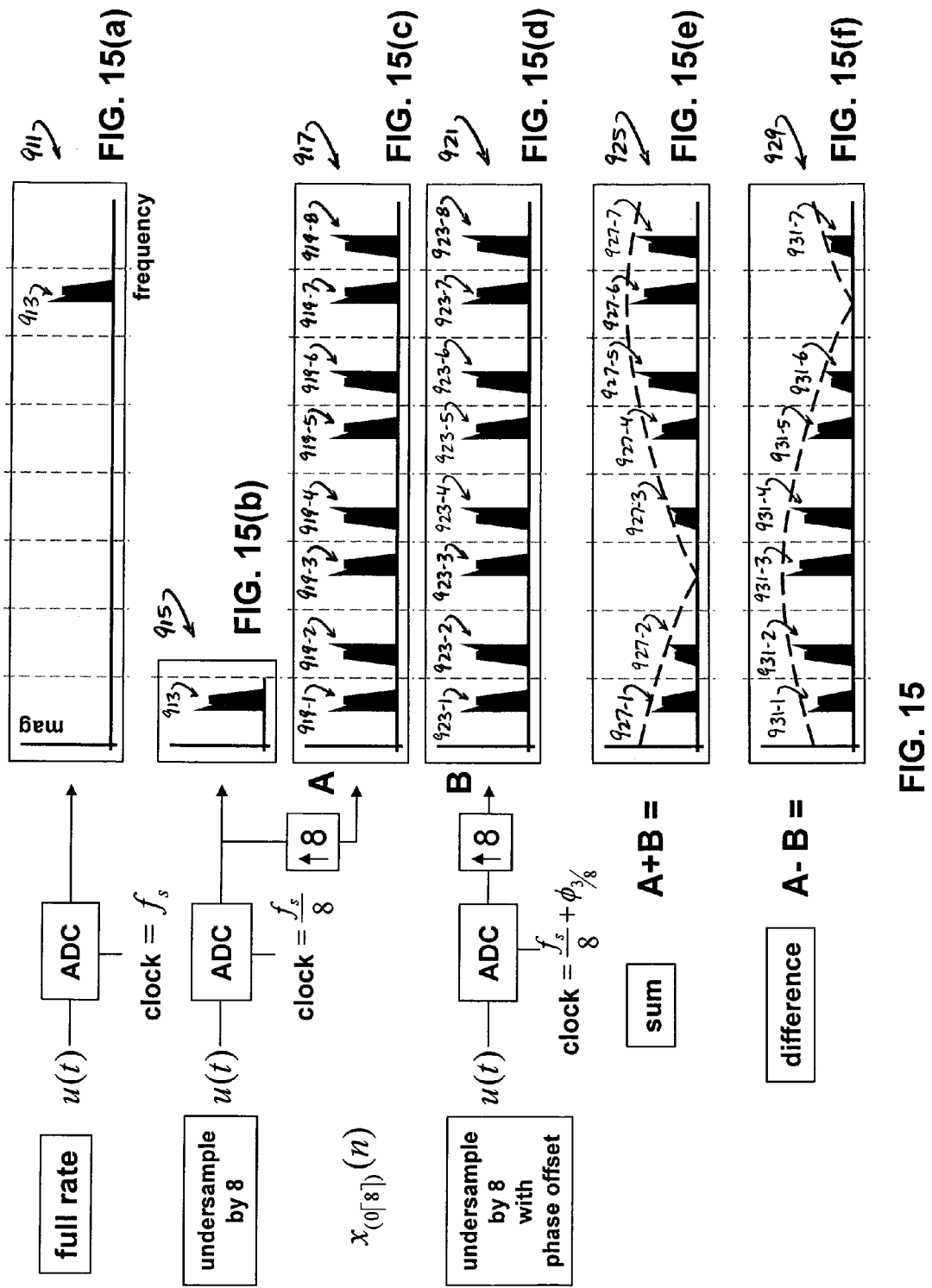
FIGS. 15(a)-(f) are a series of graphical representations of a sample signal at various times during its processing by the equalization subsystem shown in FIG. 4, the graphical representations being useful in understanding how the equalization subsystem can use calibration distortion to remedy sub-sampling defects created by an analog-to-digital converter using a low sampling rate.

Specifically, referring now to FIG. 15(*a*), there is shown a distorted full-rate signal produced by an interleaved ADC, said signal being identified generally by reference numeral 911. In the present example, a full-rate signal 911 includes eight separate frequency zones, with a "true" image 913 located in the seventh frequency zone. As seen most clearly in FIG. 15(*b*), when the sampling rate of the interleaved ADC is reduced by a factor of 8, all of the signal information in the initial spectrum, including "true" image 913 is folded down into the lowest 1/8th of the spectrum, said signal being identified generally by reference numeral 915.

As seen most clearly in FIG. 15(*c*), upsampling signal 915 by a factor of eight expands signal 915 back to into the full band spectrum of the input signal, said signal being identified herein by reference numeral 917. However, as can be seen, eight ambiguous, or "hypothesis", images 919-1 thru 919-8 are generated as part of the upsampling process, with only one of said images 919 being the "true" image 913. As will be described below, phase encoding can be used to determine which of "hypothesis" images 919 is "true" image 913.

Specifically, in order to ascertain the "true" image, signal 915 is upsampled by a factor of eight with a phase offset to generate a second set of downsampled data points, the resultant signal being identified generally as reference numeral 921 in FIG. 15(*d*). As can be seen, phase encoded images 923-1 thru 923-8 are generated from the secondary signal expansion.

It should be noted that the secondary set of downsampled data points is preferably offset by an odd number of samples from the first set of downsampled data points. For example, the offset value may be determined using the formula $D/2 \pm 1$ to ensure an odd value, where D is the undersampling ratio and is assumed to be a multiple of two.

Summing the primary and secondary sets of downsampled data points (i.e., signals 917 and 921) in phase generates the resulting signal shown in FIG. 15(*e*), which is identified generally by reference numeral 925. As can be seen, signal 925 includes a series of images of varying amplitude 927-1 thru 927-7. As can be appreciated, the target image 913 is determined by identifying the frequency zone in which the strongest of images 927-1 thru 927-7 is located (i.e., the 7$^{th}$ frequency zone).

Similarly, subtracting in phase the secondary set of downsampled data points from the primary set of downsampled data points generates the resulting signal shown in FIG. 15(*f*), which is identified generally by reference numeral 929. As can be seen, signal 929 includes a series of hypothesis images of varying amplitude 931-1 thru 931-7. As can be appreciated, the target image 913 is determined by identifying the frequency zone in which the weakest hypothesis image 931-1 thru 931-7 is located (i.e., the $7^{th}$ frequency zone).

The embodiments shown of the present invention are intended to be merely exemplary and those skilled in the art shall be able to make numerous variations and modifications to them without departing from the spirit of the present invention. All such variations and modifications are intended to be within the scope of the present invention as defined in the appended claims.

What is claimed is:

1. A signal processing system comprising:
   (a) a multi-channel subsystem for converting a set of analog input signals into an unequalized, digitized complete-channel output signal which includes a plurality of sub-channels, and
   (b) an equalization subsystem for calibrating the unequalized, digitized complete-channel output signal to yield an equalized, digitized complete-channel output signal,
   (c) wherein the equalization subsystem comprises a multi-channel corrector for calibrating the individual sub-channels of the unequalized, digitized complete-channel output signal relative to one another, the multi-channel corrector comprising a plurality of filters, each of the plurality of filters being assigned to calibrate a corresponding sub-channel using all sub-channel data from the unequalized, digitized complete-channel output signal.

2. The signal processing system as claimed in claim 1 wherein the multi-channel corrector calibrates the individual sub-channels of the unequalized, digitized complete-channel output signal relative to one another to treat interleaving errors present therein.

3. The signal processing system of claim 1 wherein each filter includes an equalization coefficient which has a linear correspondence with at least one of the unequalized, digitized complete-channel output signal and the equalized, digitized complete-channel output signal.

4. The signal processing system of claim 3 wherein the equalization subsystem further comprises:
   (a) means for separating the complete-channel signal filtered by the multi-channel corrector into its plurality of sub-channels,
   (b) a channel offset corrector for adding a constant DC offset term to each sub-channel, and
   (c) means for combining the processed sub-channels together to create the equalized complete-channel output signal.

5. The signal processing system of claim 3 wherein the equalization subsystem further comprises:
   (a) a channel separator for separating the unequalized complete-channel output signal into its plurality of sub-channels, each sub-channel including at least one distortion product,
   (b) a single-channel corrector for independently treating each of the plurality of sub-channels to reduce the at least one distortion product present therein, and
   (c) a subchannel re-combiner for combining the plurality of sub-channels processed by the single-channel corrector to yield a partially equalized, complete-channel digital signal which is then passed, in its entirety, into the multi-channel corrector.

6. The signal processing system of claim 5 wherein the single-channel corrector comprises a plurality of single-channel equalization elements, each equalization element being designated to treat signal distortions present within a corresponding sub-channel of the unequalized complete-channel signal.

7. A method of processing an unequalized complete-channel output signal produced from a multi-channel subsystem, the complete-channel output signal including a plurality of sub-channels, the method comprising the steps of:
   (a) providing a multi-channel corrector, the multi-channel corrector comprising a plurality of filters, each of the plurality of filters being assigned to calibrate a corresponding sub-channel,
   (b) passing the unequalized complete-channel signal in its entirety into each filter of the a multi-channel corrector, and
   (c) calibrating each of the plurality of sub-channels relative to one another using the corresponding filter in the multi-channel corrector.

8. The method as claimed in claim 7 wherein each of the plurality of filters has an equalization coefficient.

9. The method as claimed in claim 8 further comprising the step of, prior to said calibration step, optimizing the value of the equalization coefficient for each filter.

10. The method as claimed in claim 9 wherein said optimization step comprises the following steps:
    (a) injecting at least one known excitation signal into the multi-channel subsystem to yield a measured, complete-channel output signal,
    (b) selecting an ideal reference signal for calculating the value of the equalization coefficient for each filter using the measured, complete-channel signal, and
    (c) calculating an equalization coefficient for each filter such that its corresponding sub-channel generates an output signal which matches the ideal reference signal.

11. The method as claimed in claim 10 wherein, in the selecting step, one of the plurality of sub-channels is utilized as the ideal reference signal.

12. The method as claimed in claim 10 wherein, in the injecting step, a tonal signal is used as the at least one excitation signal.

13. The method as claimed in claim 9 further comprising the steps of, after said calibrating step:
    (a) separating the complete-channel output signal filtered by the plurality of filters in the multi-channel corrector into its plurality of sub-channels,
    (b) adding a constant DC offset term to each of the plurality of sub-channels, and
    (c) combining the resultant sub-channels together to create the equalized complete-channel output signal.

14. The method as claimed in claim 9 further comprising the steps of, prior to said passing step:
    (a) separating the unequalized complete-channel output signal into its plurality of sub-channels, each sub-channel including at least one distortion product, and
    (b) independently treating each of the plurality of sub-channels to reduce the at least one distortion product present therein.

* * * * *